(12) United States Patent
Yamada (10) Patent No.: US 8,045,395 B2
(45) Date of Patent: Oct. 25, 2011

(54) CIRCUITS, SYSTEMS AND METHODS FOR DRIVING HIGH AND LOW VOLTAGES ON BIT LINES IN NON-VOLATILE MEMORY

(75) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/780,594

(22) Filed: May 14, 2010

(65) Prior Publication Data

US 2010/0220530 A1    Sep. 2, 2010

Related U.S. Application Data

(62) Division of application No. 11/705,896, filed on Feb. 13, 2007, now Pat. No. 7,719,899.

(51) Int. Cl.
*G11C 11/34* (2006.01)
*G11C 16/06* (2006.01)

(52) U.S. Cl. ......... 365/185.23; 365/185.25; 365/185.09; 365/189.11; 365/230.06

(58) Field of Classification Search ............. 365/185.18, 365/185.21, 185.23, 189.09, 189.07, 230.06
See application file for complete search history.

(56) References Cited

U.S. PATENT DOCUMENTS

| | | | |
|---|---|---|---|
| 5,657,268 A | 8/1997 | Truong et al. | 365/185.13 |
| 5,680,347 A | 10/1997 | Takeuchi et al. | 365/185.17 |
| 5,682,350 A | 10/1997 | Lee et al. | 365/185.13 |
| 5,754,475 A | 5/1998 | Bill et al. | 365/185.25 |
| 5,822,248 A | 10/1998 | Satori et al. | 365/185.21 |
| 5,920,503 A | 7/1999 | Lee et al. | 365/185.11 |
| 5,940,321 A | 8/1999 | Takeuchi et al. | 365/185.17 |
| 5,973,961 A | 10/1999 | Park et al. | 365/185.13 |
| 5,978,262 A | 11/1999 | Marquot et al. | 365/185.01 |
| 5,978,267 A | 11/1999 | Chen et al. | 365/185.17 |
| 6,005,802 A | 12/1999 | Takeuchi et al. | 365/185.02 |
| 6,028,794 A | 2/2000 | Nakai et al. | 365/185.29 |
| 6,046,940 A | 4/2000 | Takeuchi et al. | 365/185.17 |
| 6,049,491 A | 4/2000 | La Rosa | 365/189.09 |
| 6,049,494 A | 4/2000 | Sakui et al. | 365/203 |
| 6,058,044 A | 5/2000 | Sugiura et al. | 365/185.17 |
| 6,061,273 A | 5/2000 | Pascucci | 365/185.25 |
| 6,081,456 A | 6/2000 | Dadashev | 365/185.23 |
| 6,147,906 A | 11/2000 | Bill et al. | 365/185.14 |
| 6,160,297 A | 12/2000 | Shimizu et al. | 257/390 |
| 6,219,279 B1 | 4/2001 | Manolescu et al. | 365/185.21 |
| 6,240,020 B1 | 5/2001 | Yang et al. | 365/185.25 |
| 6,327,181 B1 | 12/2001 | Akaogi et al. | 365/185.11 |
| 6,329,245 B1 | 12/2001 | Da et al. | 438/264 |

(Continued)

*Primary Examiner* — Hoai V Ho
*Assistant Examiner* — Kretelia Graham
(74) *Attorney, Agent, or Firm* — Dorsey & Whitney LLP (57) ABSTRACT

An integrated circuit bit line driver system includes a plurality of bit line drivers coupled to respective bit lines of an array of non-volatile memory cells. Each of the bit line drivers includes a bias transistor through which an input signal is coupled to the respective bit line. The bit line driver system includes a bias voltage circuit that generates a bias voltage that is coupled to the respective gates of the bias transistors. The bias voltage circuit initially accelerates the charging of the transistor gates, and subsequently completes charging the gates at a slower rate. The bias voltage is generated using a diode-coupled transistor having electrical characteristics the match those of the bias transistors so that the bias voltage varies with process or temperature variations of the integrated circuit in the same manner as the threshold voltage of the bias transistors vary with process or temperature variations.

23 Claims, 5 Drawing Sheets

U.S. PATENT DOCUMENTS

| | | | | |
|---|---|---|---|---|
| 6,366,492 | B1 | 4/2002 | Kawasumi | 365/154 |
| 6,373,746 | B1 | 4/2002 | Takeuchi et al. | 365/185.03 |
| 6,452,823 | B1 | 9/2002 | Naji | 365/50 |
| 6,480,419 | B2 | 11/2002 | Lee | 365/185.18 |
| 6,490,212 | B1 | 12/2002 | Nguyen et al. | 365/207 |
| 6,525,973 | B1 | 2/2003 | Shokouhi et al. | 365/189.12 |
| 6,532,176 | B1 | 3/2003 | Kushnarenko | 365/185.25 |
| 6,646,930 | B2 | 11/2003 | Takeuchi et al. | 365/200 |
| 6,654,290 | B2 | 11/2003 | Lee et al. | 365/185.23 |
| 6,717,207 | B2 | 4/2004 | Kato | 257/316 |
| 6,751,124 | B2 | 6/2004 | Lee | 365/185.18 |
| 6,798,697 | B2 | 9/2004 | Hosono et al. | 365/185.12 |
| 6,813,187 | B2 | 11/2004 | Lee | 365/185.18 |
| 6,816,423 | B2 | 11/2004 | Yamada | 365/203 |
| 6,834,315 | B2 | 12/2004 | Johnson | 710/6 |
| 6,842,337 | B2 | 1/2005 | Helot et al. | 361/683 |
| 6,858,494 | B2 | 2/2005 | Hsieh | 438/257 |
| 6,870,750 | B2 | 3/2005 | Siek | 365/63 |
| 6,882,569 | B2 | 4/2005 | Hosono et al. | 365/185.17 |
| 6,885,602 | B2 | 4/2005 | Cho et al. | 365/211 |
| 6,903,981 | B2 | 6/2005 | Futatsuyama et al. | 365/185.33 |
| 6,906,945 | B2 | 6/2005 | Madan | 365/145 |
| 6,907,497 | B2 | 6/2005 | Hosono et al. | 711/103 |
| 6,912,160 | B2 | 6/2005 | Yamada | 365/185.2 |
| 6,925,008 | B2 | 8/2005 | Ichige et al. | 365/185.17 |
| 6,928,022 | B2 | 8/2005 | Cho et al. | 365/225.7 |
| 6,934,179 | B2 | 8/2005 | Shuto | 365/145 |
| 6,937,510 | B2 | 8/2005 | Hosono et al. | 365/185.03 |
| 6,940,758 | B2 | 9/2005 | Chung | 365/185.25 |
| 6,950,341 | B2 | 9/2005 | Takano et al. | 365/185.21 |
| 6,956,770 | B2 | 10/2005 | Khalid et al. | 365/185.12 |
| 6,970,388 | B2 | 11/2005 | Takeuchi et al. | 365/200 |
| 7,009,878 | B2 | 3/2006 | Hosono et al. | 365/185.03 |
| 7,012,841 | B1 * | 3/2006 | Nahas | 365/189.09 |
| 7,016,985 | B2 | 3/2006 | Johnson | 710/6 |
| 7,020,020 | B1 | 3/2006 | Lojek | 365/185.18 |
| 7,020,026 | B2 | 3/2006 | Guterman et al. | 365/185.28 |
| 7,038,946 | B2 | 5/2006 | Hosono et al. | 365/185.17 |
| 7,050,334 | B2 | 5/2006 | Kim et al. | 365/185.28 |
| 7,064,980 | B2 | 6/2006 | Cernea et al. | 365/185.11 |
| 7,067,871 | B2 | 6/2006 | Ozawa | 257/315 |
| 7,082,055 | B2 | 7/2006 | Ichige et al. | 365/185.17 |
| 7,082,061 | B2 | 7/2006 | Chou et al. | 365/189.06 |
| 7,082,069 | B2 | 7/2006 | Chou et al. | 365/203 |
| 7,085,174 | B2 | 8/2006 | Hidaka | 365/189.09 |
| 7,117,296 | B2 | 10/2006 | Hosono et al. | 711/103 |
| 7,123,521 | B1 | 10/2006 | Louie et al. | 365/189.05 |
| 7,142,475 | B2 | 11/2006 | Tsern et al. | 365/222 |
| 7,307,268 | B2 * | 12/2007 | Scheuerlein | 257/2 |
| 7,453,748 | B2 | 11/2008 | Chang | 365/203 |

* cited by examiner

FIGURE 5

CIRCUITS, SYSTEMS AND METHODS FOR DRIVING HIGH AND LOW VOLTAGES ON BIT LINES IN NON-VOLATILE MEMORY

CROSS-REFERENCE TO RELATED APPLICATION

This application is a divisional of U.S. patent application Ser. No. 11/705,896, filed Feb. 13, 2007. This application is incorporated by reference herein in its entirety and for all purposes.

TECHNICAL FIELD

Embodiments of the invention relate to non-volatile memory devices, and, more particularly, to non-volatile memory device bit line drivers.

BACKGROUND OF THE INVENTION

Figure 1:
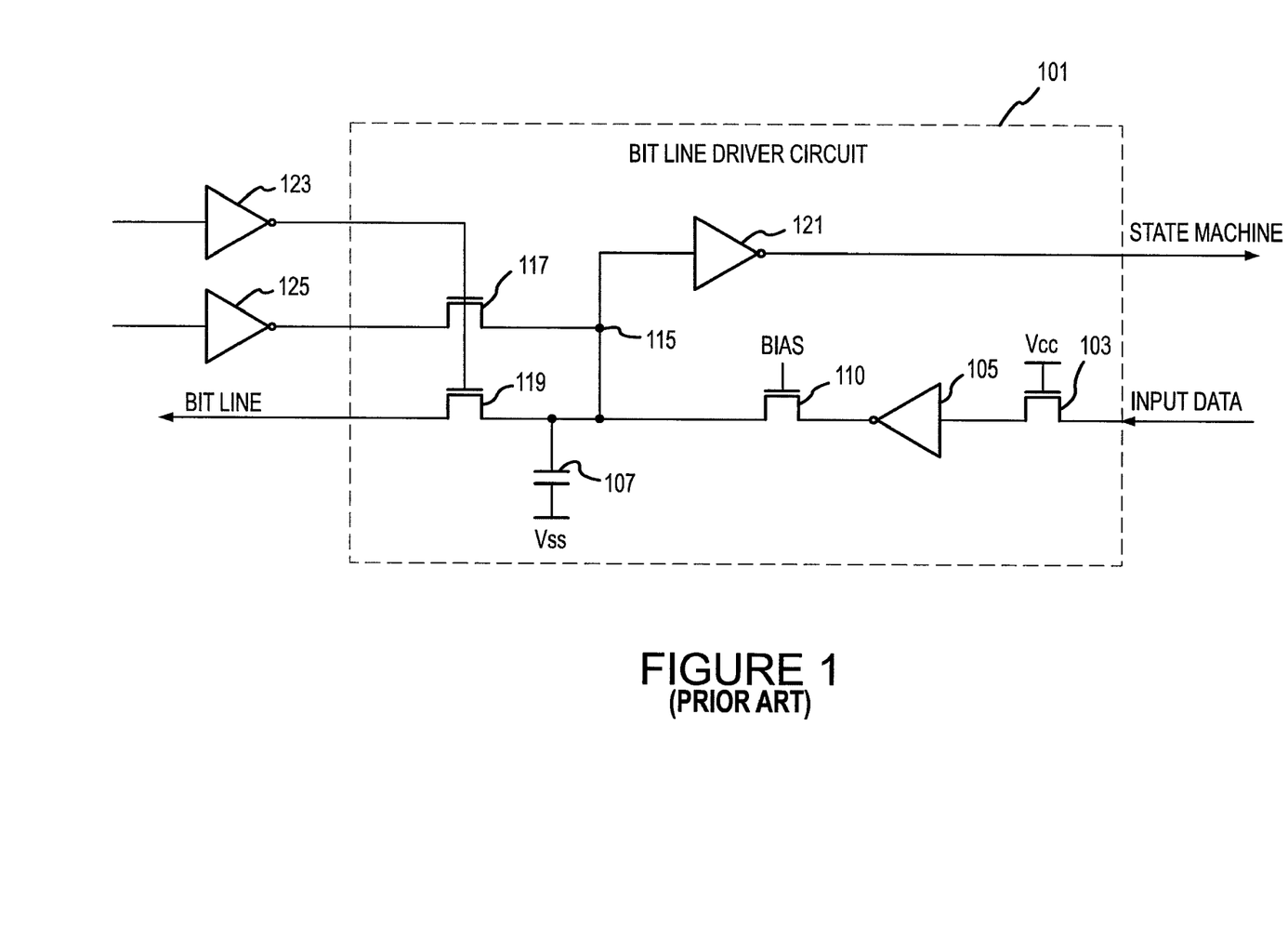
FIG. 1 is a block diagram showing a bit line driver coupled to a respective bit line in an array of memory cells.

Memory read, erase or program operations are conventionally executed in response to external signals provided to the memory by a controller (not shown) or other memory access device (also not shown). A bit line coupled to a selected memory cell to be read, erased or programmed must be pre-charged or prepared for executing a particular memory operation. FIG. 1 shows a block diagram of a prior art bit line driver 101 coupled to a bit line of a memory array. The bit line driver 101 is designed to meet a number of operating requirements during a memory operation. For example, during a programming operation, the bit line driver 101 receives data to be programmed to a selected memory cell, and applies the programming data signal to the bit line. Memory having multi-level cells require multiple programming voltages and/or programming pulse widths corresponding to combinations of the multiple data bits that can be stored in the memory cell.

An input data bit received by the memory device are applied to an inverter 105 through an NMOS transistor 103 that is continuously turned ON by a supply voltage Vcc coupled to its gate. The output signal of the inverter 105 is applied to a node 115 through an NMOS bias transistor 110 that receives a predetermined bias voltage. A number of components are coupled to the node 115 to allow the bit line driver 101 to perform several functions. The node 115 is coupled to the corresponding bit line by an NMOS transistor 119, and also through an NMOS transistor 117 to an output of an inverter 125, which precharges the node 115 to a voltage Vcc or Vss depending on a voltage applied to the input of the inverter 125. The respective gates of the transistors 117, 119 are coupled to an output of an inverter 123 so that both transistors 117, 119 are turned ON responsive to a low applied to the input of the inverter 123. The output node 115 is also coupled to a state machine through an inverter 121 that communicates signals to the state machine during programming operations. For example, the state machine may receive an instruction set to program a particular block of memory. In response, the state machine signals the bit line driver 101 to precharge the bit line or it may cause a predetermined programming voltage to be applied to the selected bit line during a programming operation.

In operation, the manner in which the bit line driver 101 responds to the input data bit depends upon the initial state of the output node 115. For example, the state machine may interpret a low at the output of the inverter 121 as indicating that a program operation is needed to change the state of a memory cell being programmed. Thus, if the output node 115 is initially at $V_{CC}$, an active operation occurs in which the input data bit applied to the inverter 105 controls the state of the output node 115. Therefore, if the input data bit is high, the output node 115 will be pulled to the low ($V_{SS}$) at the output of the inverter 105 through the transistor 110, which is turned ON by the bias voltage. If the input data bit is low, the output of the inverter 105 will by high. In such case, the transistor 110 will be turned OFF. Although the inverter 105 will be unable to drive the output node 115 high, the output node 115 will nevertheless remain high because of the charge on a capacitor 107 that is coupled to the output node 115.

If the state machine interprets a low at the output of the inverter 121 as calling for an active operation, it may interpret a high at the output of the inverter 121 as calling for a null operation in which the input data applied to the inverter 105 does not control the state of the output node 115. In the case of a null operation, the output node 115 will initially be discharged to $V_{SS}$. If the input data bit is high, the output of inverter 105 will be low, and the output node 115 will therefore remain at $V_{SS}$. Finally, if the input data bit is low, the output of the inverter 105 will be high. The transistor 110 will be turned ON by the bias voltage to allow the output of the inverter 105 to charge the output node 115. However, the voltage of the output node 115 will increase only until it reaches the bias voltage less the threshold voltage of the transistor 110, at which point the transistor 110 will turn OFF. By choosing the magnitude of the bias voltage so that it is substantially equal to $V_T$-$V_{SS}$, where $V_T$ is the threshold voltage of the transistor 110, the output node 115 will remain at $V_{SS}$, thereby continuing to indicate a null operation to the state machine. Thus, by keeping the magnitude of the bias voltage at substantially equal to $V_T$-$V_{SS}$, the bit line driver 101 can maintain the proper voltage on the output node 115 for all values of the input data bit in both the active operation and the null operation. The operation of the bit line driver 101 for both values of input data bits in the active operation and the null operation are summarized in Table 1, below:

TABLE 1

|  | Initial State of Node 115 | Input Data | Final State of Node 115 |
| --- | --- | --- | --- |
| Case #1 | Vcc | 1 | Vss |
| Case #2 | Vcc | 0 | Vcc |
| Case #3 | Vss | 1 | Vss |
| Case #4 | Vss | 0 | Vss |

Unfortunately, it is difficult to maintain the bias voltage at the correct magnitude since the bias voltage can vary significantly with different process variations and as the temperature of the integrated circuit substrate varies. As a result, the voltage of the output node 115 can rise to unacceptable levels in the null operation when the input data bit is low. More specifically, if the voltage of the output node 115 increases above the threshold voltage of an NMOS transistor (not shown) in the inverter 121, the NMOS transistor and a complementary PMOS transistor (not shown) connected in series with the NMOS transistor will both be ON at the same time. Insofar as a bit line driver 101 is provided for each column of a memory device, the amount of power consumed by the transistors in the inverter 121 can be considerable. Also, in some cases, the inverter 121 may apply a signal to the state machine that incorrectly calls for an active operation.

There is, therefore, a need for a bit line driver in a non-volatile memory device and method for generating a bias voltage that ensures the correct operation of the bit line driver for all operating conditions despite process and temperature variations.

DETAILED DESCRIPTION

Embodiments of the invention are directed to non-volatile memory devices whose bit lines of a memory array are coupled to bit line drivers that includes a bias voltage generator. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
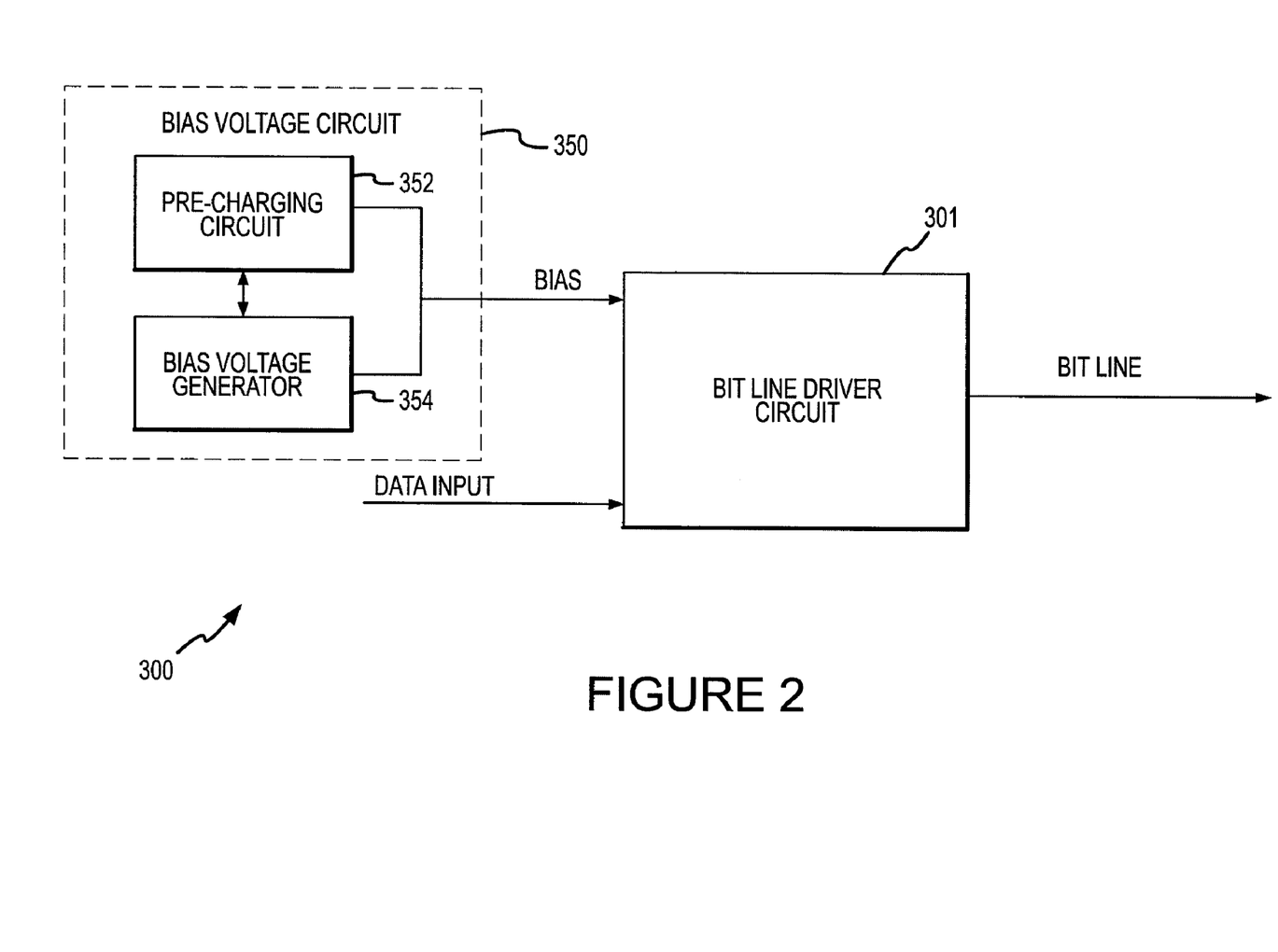
FIG. 2 is a block diagram showing a bias voltage circuit coupled to a bit line driver of FIG. 1, according to an embodiment of the invention.

FIG. 2 shows a bit line driver system 300 that includes a bit line driver 301 coupled to receive a BIAS signal from a bias voltage circuit 350 according to an embodiment of the invention. The bit line driver 301 receives an input data signal and controls the voltage level applied to a respective bit line, as previously described. The bit line driver 301 is the same as the bit line driver 101 shown in FIG. 1, except that the BIAS voltage signal is generated by the bias voltage circuit 350. The bias voltage circuit 350 includes a bias voltage generator 354 that generates the appropriate bias voltage applied to the bit line driver 301. Because of the time required for coupling the BIAS voltage signal to each of the bit line drivers 301, which will be described further, the bias voltage circuit 350 also includes a pre-charging circuit 352 that expedites the time for applying the BIAS signal to the gate of the transistor 110 (FIG. 1) in the bit line driver circuit 101. The combined functionality of the bias voltage generator 354 and the pre-charging circuit 352 provides advantageous operating capabilities for both values of input data bits in both active operation and null operation, as described further below.

Figure 3:
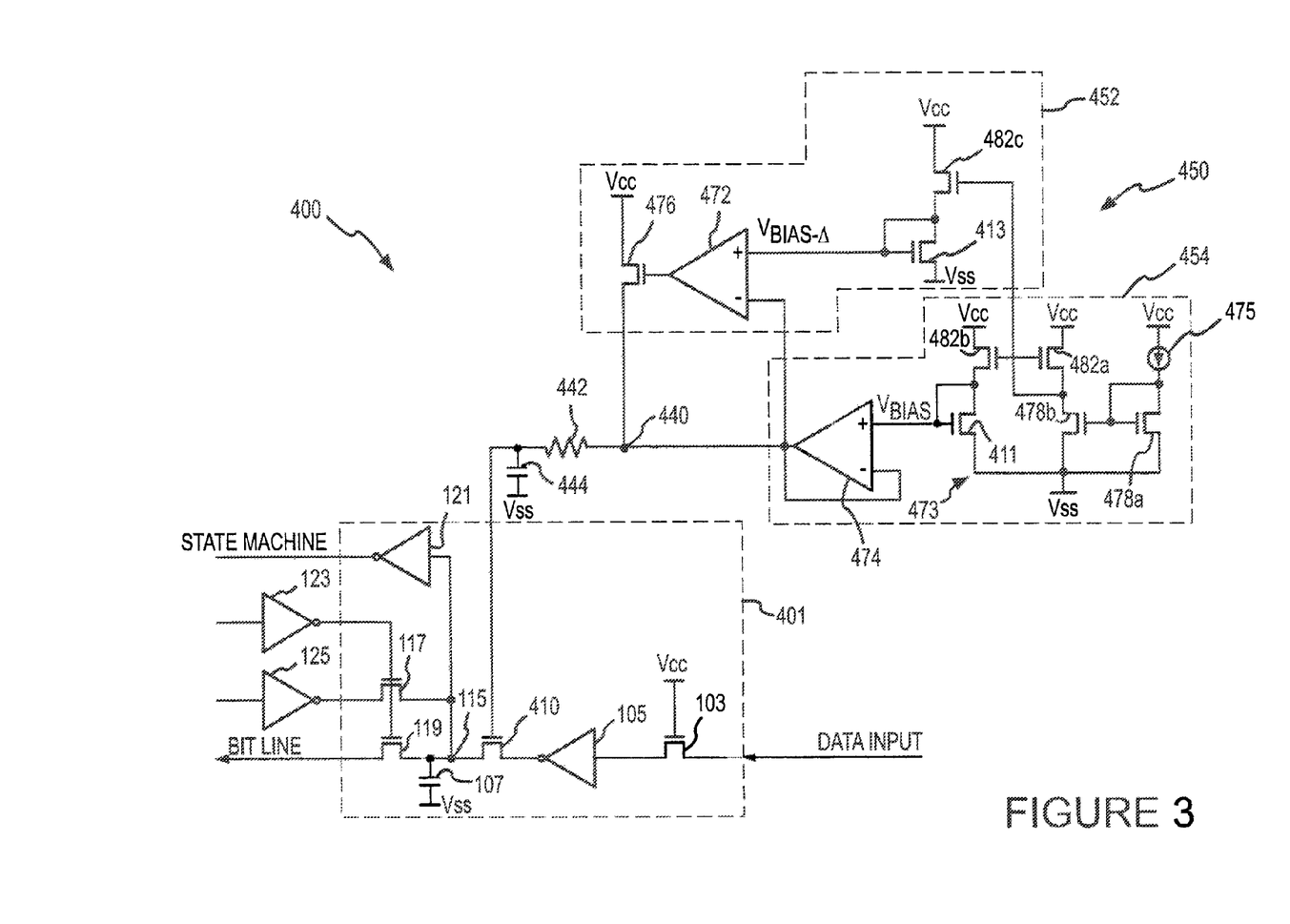
FIG. 3 is a schematic diagram of a bias voltage circuit coupled to a bit line driver, according to an embodiment of the invention.

FIG. 3 is a schematic drawing of a bit line driver system 400 that illustrates in more detail the bit line driver system 300 of FIG. 2. The bit line driver 401 is the same as the bit line driver 101 of FIG. 1, except that the gate of an NMOS bias transistor 410 is coupled to the output of a bias voltage circuit 450. Several of the components in the bit line driver 401 are the same as components in the bit line driver 101 in FIG. 1, and are identified by the same reference numbers. In the interest of brevity, an explanation of the structure and operation of these same components will not be repeated. As described, a bias voltage circuit 450 utilizes the combination of a bias voltage generator 454 and a pre-charging circuit 452 to generate a BIAS signal that is applied to the transistor 410. The outputs of the bias voltage circuit 450 and the pre-charging circuit 452 are coupled to a bias node 440 that provides a bias signal to control the bias transistor 410 of the bit line driver 401. In such manner, the bias voltage circuit 450 is coupled to each of the bit line drivers 401 that are in turn coupled to each of the bit lines in the memory array. The bias node 440 is additionally coupled to a low pass filter that is formed by a series resistor 442 and a capacitor 444 coupled to ground. This low pass filter attenuates noise and other interference before the generated bias signal is applied to the bias transistor 410.

The bias voltage generator 454 includes a current mirror circuit 473 having a pair of NMOS transistors 478a,b coupled between two voltage supplies Vcc and Vss. The current mirror circuit 473 may be the current mirror circuit 473 in the bias voltage generator 454 or any other embodiment as known in the art. The transistors 478a,b are coupled together in a manner such that a current is generated through the drain-to-source channel of the transistor 478b that mirrors a current through the drain-to-source channel of the transistor 478a, which is generated by a current source 475 coupled to the drain of the transistor 478a. Similarly, a pair of NMOS transistors 482a,b are coupled together (also between two voltage supplies Vcc and Vss) and the source of the transistor 482a is biased to the drain of the transistor 478b. As a result, a current generated through the drain-to-source channels of the respective transistors 482a,b is also the current through the transistor 478a. The source of the transistor 482b is additionally coupled to the drain and gate of an NMOS bias transistor 411 whose gate is also coupled to a first input of a comparator 474.

In operation, the bias transistor 411 provides to the comparator 474 a bias voltage $V_{BIAS}$ that is generated by the mirrored current through the transistor 411. The output of the comparator 474 is coupled to the inverting input of the comparator so that it operates as a voltage follower. Therefore, the comparator 474 outputs the bias voltage $V_{BIAS}$ with a low output impedance, which is applied to the gate of the bias transistor 410. The bias transistor 411 and the bias transistor 410 have the exact same characteristics such that the bias voltage $V_{BIAS}$ will vary with process and temperature variations in the same manner as the bias transistor 410. Therefore, the bias voltage $V_{BIAS}$ will track variations of the threshold voltage $V_T$ of the transistor 410 due to process and temperature variations.

Although only one bias transistor 410 is shown in the embodiment of FIG. 3 to illustrate the operation of the single bit line driver 401, it should be noted that a bias transistor 410 is provided for each of a large number of bit lines in a memory device. Due to the heavy load of the large number of bias transistors 410, the bias voltage can take a very long time to build up at the bias node 440. Therefore, the pre-charging circuit 452 is used to quickly charge up the bias voltage at the bias node 440. The pre-charging circuit 452 includes a comparator 472 having a first input coupled to the gate of an NMOS bias transistor 413. The gate and drain of the bias transistor 413 is additionally coupled to an NMOS transistor 482c, that is biased by coupling its gate to the gates of the transistors 482a,b of the mirror circuit 473. The transistors 413, 482c are additionally coupled between two voltage supplies Vcc and Vss. Therefore, the transistor 482c has a drain-to-source current that is mirrored to the currents generated by the current mirror circuit 473. This current is coupled through an NMOS transistor 413, which provides a bias voltage ("Vbias-Δ") to the first input of the comparator 472. The transistor 413 is designed with a drain-to-source impedance that is slightly less than the drain-to-source impedance of the transistor 411. As a result, the voltage Vbias-Δ is slightly less than the voltage $V_{BIAS}$.

A second input of the comparator 472 is coupled to the output signal of the comparator 474 such that the Vbias-Δ voltage is compared to the bias voltage $V_{BIAS}$ generated at the output for the comparator 474. The output of the comparator 472 is coupled to the gate of another NMOS transistor 476, whose drain is coupled to a high voltage supply Vcc and the source is coupled to the output of the comparator 474.

In operation, if the Vbias-Δ voltage is greater than the bias voltage $V_{BIAS}$, the comparator 472 turns ON the transistor 476 thereby applying $V_{CC}$ to the bias node 440. As a result, the bias node 440 is quickly charged towards the supply voltage Vcc until the bias node 440 is charged to the Vbias-Δ voltage. At that point, the comparator 472 turns OFF the transistor 476. The comparator 474 then completes charging the bias node 440 to the bias voltage.

Figure 4:
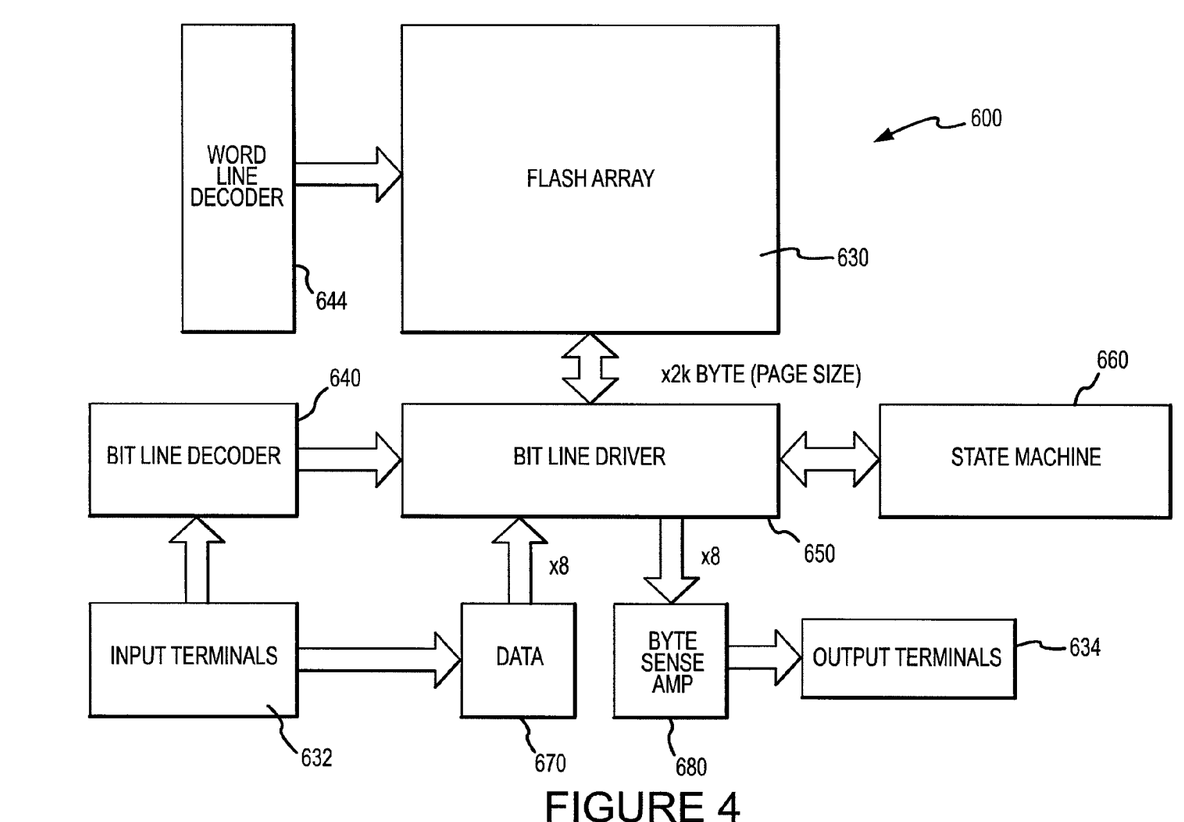
FIG. 4 is a block diagram showing a flash memory device having a bias voltage circuit coupled to a plurality of bit line drivers respectively coupled to a plurality of bit lines, according to an embodiment of the invention.

A flash memory device 600 that includes the bit line driver system according to one embodiment of the invention is shown in FIG. 4. The flash memory device 600 includes an array 630 of flash memory cells arranged in banks of rows and columns. Command signals, address signals and write data signals are applied to the memory device 600 as sets of sequential input/output ("I/O") signals applied to respective input terminals 632. Read data signals are output from the flash memory device 600 through respective output terminals 634. In practice, the same terminals can be for some of the input terminals 632 and output terminals 634, such as data terminals that receive write data and output read data.

Address signals applied to the input terminals 632 are coupled to a bit line decoder 640 and to a word line decoder 644. The word line decoder 644 applies signals to word lines (not shown) in the array 630 based on a row address corresponding to the address signals. Similarly, the bit line decoder 640 selects one or more bit lines based on respective column addresses corresponding to the address signals. The signals generated by the bit line decoder 640 are applied to a set of bit line drivers 650, which may be the bit line drivers 301 or 401 shown in FIGS. 2 and 3, respectively, or a bit line driver according to some other embodiment of the invention. The bit line decoder 640 may, for example, apply signals to the inverter 123 (FIG. 3) in the bit line drivers 401. As explained above, each of the bit line drivers 650 applies signals to respective state machines 660 indicative of the state of the respective bit line. As also explained above, the bit line drivers 650 are coupled to the array 630 through respective bit lines.

Write data signals applied to the input terminals 632 are applied to an input data drivers 670, and from the drivers 670 to the input data terminals of the bit line drivers 650, as explained above with reference to FIG. 3. Read data signals applied to bit lines in the array 630 are detected by sense amplifiers 680, which apply corresponding write data signals to the output terminals 634.

Figure 5:
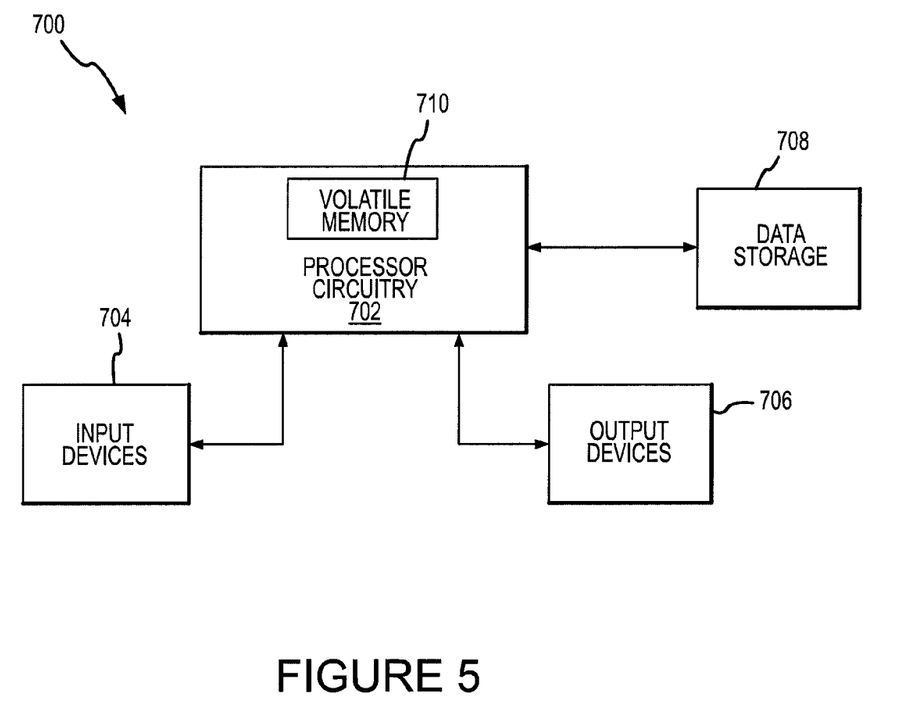
FIG. 5 is a simplified block diagram of a processor-based system including the flash memory device of FIG. 4.

FIG. 5 is a block diagram of a processor-based system 700 including processor circuitry 702 having a volatile memory 710. The processor circuitry 702 is coupled through address, data, and control buses to the volatile memory 710 to provide for writing data to and reading data from the volatile memory 710. The processor circuitry 702 includes circuitry for performing various processing functions, such as executing specific software to perform specific calculations or tasks. The processor-based system 700 also includes one or more input devices 704 coupled to the processor circuitry 702 to allow an operator to interface with the processor-based system 700. Examples of input devices 704 include keypads, touch screens, and scroll wheels. The processor-based system 700 also includes one or more output devices 706 coupled to the processor circuitry 702 to provide output information to the operator. In one example, the output device 706 is a visual display providing visual information to the operator. Data storage 708 is also coupled to the processor circuitry 702 to store data that is to be retained even when power is not supplied to the processor-based system 700 or to the data storage 708. The flash memory device 600, or a flash memory device according to some other example of the invention, can be used for the data storage 708.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. A bit line driver system coupled to a plurality of bit lines, the bit lines being coupled to respective columns of non-volatile memory cells, the bit line driver system comprising:
    a plurality of bit line drivers, each bit line driver being coupled to a respective one of the bit lines, each of the bit line drivers including a bias transistor through which an input data signal is coupled to the respective bit line, each of the bias transistors having a respective gate;
    a current generator generating a reference current;
    a current mirror circuit coupled to receive the reference current from the current generator, the current mirror including a diode-coupled reference transistor through which a mirrored current is conducted so that the reference transistor generates a reference voltage between a source and a drain of the reference transistor; and
    a bias voltage generator coupled to receive the reference voltage from the current mirror circuit, the bias voltage generator being operable to generate a bias voltage corresponding to the reference voltage, the bias voltage generator being coupled to supply the bias voltage to the respective gates of the bias transistors.

2. The bit line driver system of claim 1 wherein the reference transistor has electrical characteristics that are substantially identical to electrical characteristics of the respective bias transistors in the bit line drivers.

3. The bit line driver system of claim 1 wherein the bias voltage generator comprises a voltage follower having an input coupled to receive the reference voltage from the reference transistor, the voltage follower having an output coupled to the respective gates of the bias transistors.

4. The bit line driver system of claim 1, further comprising:
    a second diode-coupled reference transistor through which a current is coupled that is mirrored with the reference current so that the second reference transistor generates a second reference voltage between the source and drain of the second reference transistor; and
    a comparator having a first input coupled to receive the second reference voltage from the second reference transistor and a second input coupled to the respective gates of the bias transistors, the comparator being operable to cause a supply voltage to be coupled to the respective gates of the bias transistors when a voltage applied to the second input is less than the voltage applied to the first input.

5. The bit line driver system of claim 4 wherein a drain-to-source impedance of the second reference transistor is less than a drain-to-source impedance of the reference transistor.

6. The bit line driver system of claim 4 wherein the second reference transistor has electrical characteristics that are substantially identical to electrical characteristics of the respective bias transistors in the bit line drivers.

7. The bit line driver system of claim 4, further comprising a transistor having its drain and source coupled between the supply voltage and the respective bias transistors in the bit line drivers, and its gate coupled to an output of the comparator.

8. A non-volatile memory device comprising:
an array of non-volatile memory cells arranged in columns, each column of memory cells coupled by a respective bit line;
a plurality of bit line drivers, each bit line driver being coupled to a respective one of the bit lines, each of the bit line drivers including a bias transistor through which an input data signal is coupled to the respective bit line, each of the bias transistors having a respective gate;
a current generator generating a reference current;
a current mirror circuit coupled to receive the reference current from the current generator, the current mirror including a diode-coupled reference transistor through which a mirrored current is conducted so that the reference transistor generates a reference voltage between the source and drain of the reference transistor; and
a bias voltage generator coupled to receive the reference voltage from the current mirror circuit, the bias voltage generator being operable to generate a bias voltage corresponding to the reference voltage, the bias voltage generator being coupled to supply the bias voltage to the respective gates of the bias transistors.

9. The bit line driver system of claim 8 wherein the reference transistor has electrical characteristics that are substantially identical to electrical characteristics of the respective bias transistors in the bit line drivers.

10. The bit line driver system of claim 8 wherein the bias voltage generator comprises a voltage follower having an input coupled to receive the reference voltage from the reference transistor, the voltage follower having an output coupled to the respective gates of the bias transistors.

11. The bit line driver system of claim 8, further comprising:
a second diode-coupled reference transistor through which a current is coupled that is mirrored with the reference current so that the second reference transistor generates a second reference voltage between a source and a drain of the second reference transistor; and
a comparator having a first input coupled to receive the second reference voltage from the second reference transistor and a second input coupled to the respective gates of the bias transistors, the comparator being operable to cause a supply voltage to be coupled to the respective gates of the bias transistors when a voltage applied to the second input is less than the voltage applied to the first input.

12. The memory device of claim 11 wherein a drain-to-source impedance of the second reference transistor is less than a drain-to-source impedance of the reference transistor.

13. The memory device of claim 11 wherein the second reference transistor has electrical characteristics that are substantially identical to electrical characteristics of the respective bias transistors in the bit line drivers.

14. The memory device of claim 11, further comprising a transistor having its drain and source coupled between the supply voltage and the respective bias transistors in the bit line drivers, and its gate coupled to an output of the comparator.

15. The memory device of claim 8 wherein the non-volatile memory cells comprises flash memory cells.

16. A processor-based system comprising:
a processor operable to process data and to provide memory commands and addresses;
an input device coupled to the processor;
an output device coupled to the processor; and
a non-volatile memory device, comprising:
an array of non-volatile memory cells arranged in columns, each column of memory cells coupled by a respective bit line, the memory cells in the array being programmable to multiple charge levels corresponding to different respective bit states;
a plurality of bit line drivers, each bit line driver being coupled to a respective one of the bit lines, each of the bit line drivers including a bias transistor through which an input data signal is coupled to the respective bit line, each of the bias transistors having a respective gate;
a current generator generating a reference current;
a current mirror circuit coupled to receive the reference current from the current generator, the current mirror including a diode-coupled reference transistor through which a mirrored current is conducted so that the reference transistor generates a reference voltage between the source and drain of the reference transistor; and
a bias voltage generator coupled to receive the reference voltage from the current mirror circuit, the bias voltage generator being operable to generate a bias voltage corresponding to the reference voltage, the bias voltage generator being coupled to supply the bias voltage to the respective gates of the bias transistors.

17. The processor-based system of claim 16 wherein the reference transistor has electrical characteristics that are substantially identical to electrical characteristics of the respective bias transistors in the bit line drivers.

18. The processor-based system of claim 16 wherein the bias voltage generator comprises a voltage follower having an input coupled to receive the reference voltage from the reference transistor, the voltage follower having an output coupled to the respective gates of the bias transistors.

19. The processor-based system of claim 16, further comprising:
a second diode-coupled reference transistor through which a current is coupled that is mirrored with the reference current so that the second reference transistor generates a second reference voltage between a source and a drain of the second reference transistor; and
a comparator having a first input coupled to receive the second reference voltage from the second reference transistor and a second input coupled to the respective gates of the bias transistors, the comparator being operable to cause a supply voltage to be coupled to the respective gates of the bias transistors when a voltage applied to the second input is less than the voltage applied to the first input.

20. The processor-based system of claim 19 wherein a drain-to-source impedance of the second reference transistor is less than a drain-to-source impedance of the reference transistor.

21. The processor-based system of claim 19 wherein the second reference transistor has electrical characteristics that are substantially identical to electrical characteristics of the respective bias transistors in the bit line drivers.

22. The processor-based system of claim 19, further comprising a transistor having its drain and source coupled between the supply voltage and the respective bias transistors in the bit line drivers, and its gate coupled to an output of the comparator.

23. The processor-based system of claim 16 wherein the non-volatile memory cells comprises flash memory cells.

* * * * *